US012624453B2

(12) United States Patent
Umehara et al.

(10) Patent No.: US 12,624,453 B2
(45) Date of Patent: May 12, 2026

(54) SUBSTRATE PROCESSING APPARATUS

(71) Applicant: Tokyo Electron Limited, Tokyo (JP)

(72) Inventors: Naoki Umehara, Nirasaki (JP); Syuji Nozawa, Nirasaki (JP); Ryohei Yoneda, Nirasaki (JP); Tatsuya Yamaguchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 397 days.

(21) Appl. No.: 18/324,469

(22) Filed: May 26, 2023

(65) Prior Publication Data

US 2023/0383407 A1 Nov. 30, 2023

(30) Foreign Application Priority Data

May 30, 2022 (JP) .................................. 2022-087409

(51) Int. Cl.
*C23C 16/458* (2006.01)
*C23C 16/44* (2006.01)
*C23C 16/455* (2006.01)

(52) U.S. Cl.
CPC ...... *C23C 16/4585* (2013.01); *C23C 16/4412* (2013.01); *C23C 16/45565* (2013.01)

(58) Field of Classification Search
None
See application file for complete search history.

(56) References Cited

U.S. PATENT DOCUMENTS 6,096,135 A * 8/2000 Guo .................. H01L 21/67109
118/728
2001/0003015 A1* 6/2001 Chang ............... H01L 21/28556
427/535

FOREIGN PATENT DOCUMENTS

JP       2001-329370 A     11/2001
JP       2020007608 A      1/2020

* cited by examiner

*Primary Examiner* — Jason Berman
(74) *Attorney, Agent, or Firm* — Armstrong Teasdale LLP

(57) ABSTRACT

A substrate processing apparatus includes: a processing container; a stage provided inside the processing container to place a substrate thereon; an exhaust port arranged around the stage along an inner wall of the processing container; a driver configured to move the stage up and down between a processing position and a transfer position lower than the processing position; a clamp ring that is arranged on a peripheral edge of the substrate on the stage to cover the peripheral edge of the substrate when the stage is at the processing position, and is supported by a shelf provided on a sidewall of the processing container when the stage is at the transfer position; and a pressure regulating mechanism configured to suppress a pressure difference between a space above the substrate on the stage and a space below the stage.

6 Claims, 11 Drawing Sheets

SUBSTRATE PROCESSING APPARATUS

CROSS-REFERENCE TO RELATED APPLICATION

This application is based upon and claims the benefit of priority from Japanese Patent Application No. 2022-087409, filed on May 30, 2022, the entire contents of which are incorporated herein by reference.

TECHNICAL FIELD

Various aspects and embodiments of the present disclosure relate to a substrate processing apparatus.

BACKGROUND

In a substrate processing apparatus for forming a film on a substrate, when a film-forming gas goes around the back surface of the substrate, reaction by-products (so-called deposits) adhere to the back surface of the substrate. When the deposits adhere to the back surface of the substrate, the deposits may be peeled off from the substrate during transfer of the substrate and may scatter as particles inside the substrate processing apparatus. When the particles scatter inside the substrate processing apparatus, the particles may adhere to the substrate and contaminate the substrate. Therefore, in some cases, an annular clamp ring is provided on the peripheral edge of the substrate so as to cover the peripheral edge of the substrate (see, for example, Patent Document 1 below). As a result, the film-forming gas is prevented from going around the back of the substrate.

PRIOR ART DOCUMENT

Patent Document

Patent Document 1: Japanese Laid-Open Patent Publication No. 2020-007608

SUMMARY

According to an aspect of the present disclosure, a substrate processing apparatus includes: a processing container; a stage provided inside the processing container to place a substrate on the stage; an exhaust port arranged around the stage along an inner wall of the processing container; a driver configured to move the stage up and down between a processing position where the substrate placed on the stage is processed, and a transfer position which is lower than the processing position and is a position when the substrate is loaded onto the stage and when the substrate is unloaded from the stage; a clamp ring that is arranged on a peripheral edge of the substrate on the stage to cover the peripheral edge of the substrate when the stage is at the processing position, and is supported by a shelf provided on a sidewall of the processing container when the stage is at the transfer position; and a pressure regulating mechanism configured to suppress a pressure difference between a space above the substrate on the stage and a space below the stage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus described herein will be described in detail with reference to the drawings. It should be noted that the disclosed substrate processing apparatus is not limited to the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

When processing on a substrate ends, a processing gas remaining in a space above the substrate is exhausted before the substrate is transferred. As a result, a pressure in the space above the substrate becomes lower than a pressure in a space below a stage that supports the substrate. In this state, when the stage descends to unload the substrate, a closed space is formed by the substrate, a clamp ring, and a processing container at a position where the clamp ring is supported by a sidewall of the processing container. As a result, the substrate is attracted to the space above the substrate and closely adheres to the clamp ring. Then, when the stage further descends, the stage descends with the substrate adsorbed to the clamp ring.

Further, when a gas in the space below the stage leaks from between the substrate and the clamp ring and from between the clamp ring and the sidewall of the processing container, a pressure difference between the space above the substrate and the space below the stage becomes smaller. When the pressure difference between the space above the substrate and the space below the stage becomes smaller than a predetermined value, the substrate separates from the clamp ring and falls onto the stage. As a result, the substrate may be damaged.

It is conceivable to wait for the descent of the stage until the pressure difference between the space above the substrate and the space below the stage becomes smaller than the predetermined value to avoid damage to the substrate. However, in this case, a throughput in processing the substrate is reduced.

Therefore, some embodiments of the present disclosure provide a technique capable of quickly unloading a substrate after processing.

First Embodiment

[Configuration of Substrate Processing Apparatus 10]

Figure 1:
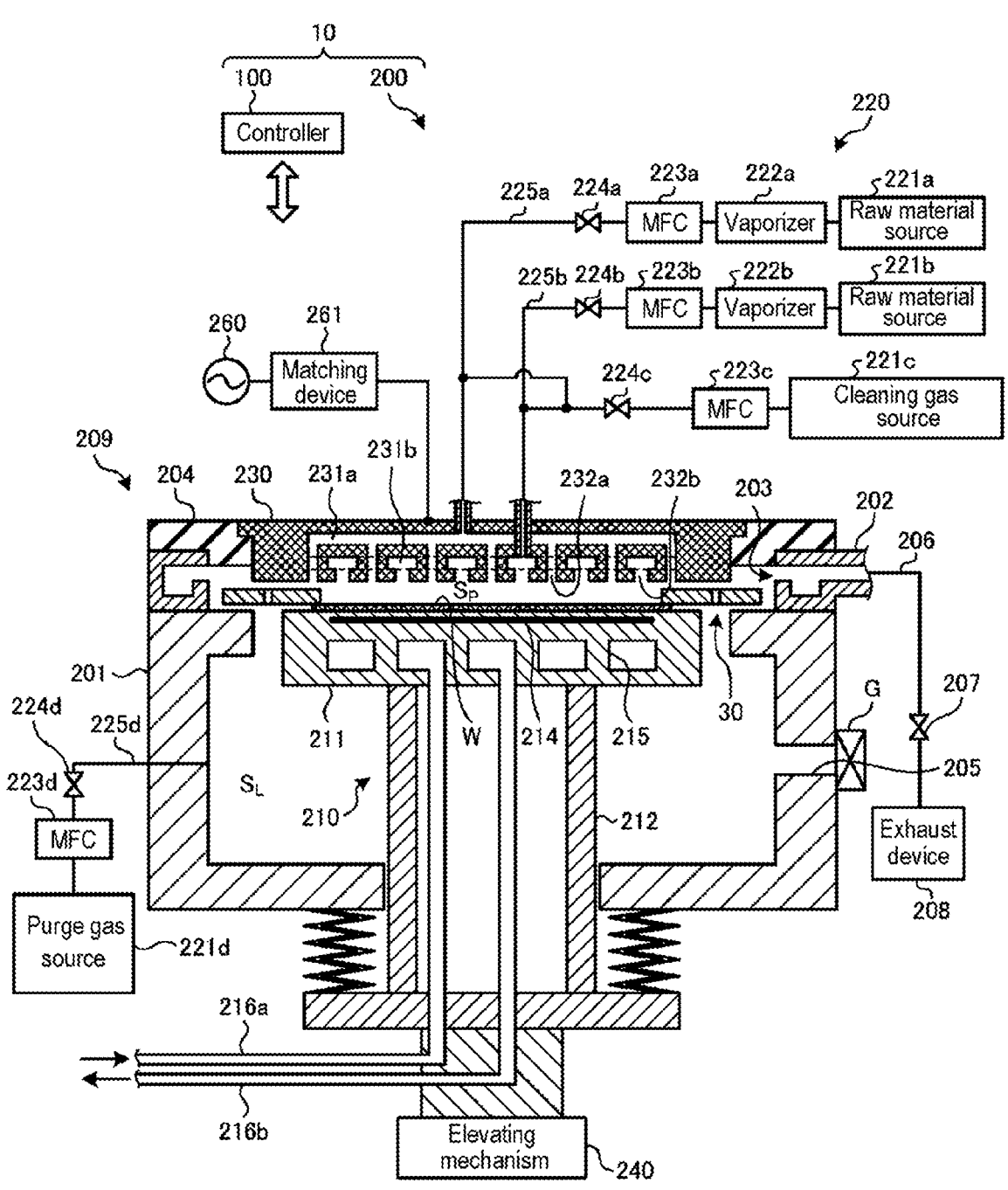
FIG. 1 is a schematic cross-sectional view showing an example of a substrate processing apparatus according to an embodiment of the present disclosure.

FIG. 1 is a schematic cross-sectional view showing an example of a substrate processing apparatus 10 according to an embodiment of the present disclosure. The substrate processing apparatus 10 includes an apparatus main body 200 and a controller 100 that controls the apparatus main body 200. The apparatus main body 200 includes a processing container 209. The processing container 209 includes a lower container 201, an exhaust duct 202, a support structure 210, and a showerhead 230.

The lower container 201 is made of metal such as aluminum. The exhaust duct 202 is provided on an upper peripheral edge of the lower container 201. The exhaust duct 202 has a longitudinal cross-section of a hollow rectangular shape and extends annularly along an upper portion of the lower container 201. A slit-shaped exhaust port 203 is formed in the exhaust duct 202. An annular insulating member 204 is arranged on the exhaust duct 202. The showerhead 230 is provided above the lower container 201 and is supported by the insulating member 204. The support structure 210 for supporting a substrate W is provided substantially in the center of the lower container 201. A space between the support structure 210 and the showerhead 230 defines a processing space $S_P$.

A sidewall of the lower container 201 is formed with an opening 205 for loading/unloading the substrate W therethrough. The opening 205 is opened/closed by a gate valve G.

One end of an exhaust pipe 206 is connected to the exhaust duct 202. The other end of the exhaust pipe 206 is connected to an exhaust device 208 equipped with a vacuum pump or the like via a pressure regulating valve 207 such as an auto pressure controller (APC) valve. The pressure regulating valve 207 is controlled by the controller 100 to control an internal pressure of the processing space $S_P$ to a preset pressure.

A heater (not shown) is provided on a sidewall of the exhaust duct 202 and an upper surface of the showerhead 230 so that the exhaust duct 202 and the showerhead 230 are heated to a temperature of, for example, 200 degrees C. or higher. As a result, reaction by-products (so-called deposits) can be suppressed from adhering to the exhaust duct 202 and the showerhead 230. Further, Heaters may also be provided in the exhaust pipe 206, the pressure regulating valve 207, and the exhaust device 208 to heat them to a temperature at which it is difficult for the deposits to adhere.

The support structure 210 includes a stage 211 and a support 212. The stage 211 is made of metal such as aluminum, and the substrate W is placed on an upper surface of the stage 211. The support 212 is made of metal such as aluminum with a cylindrical shape, and supports the stage 211 from below.

A heater 214 is buried in the stage 211. The heater 214 heats the substrate W placed on the stage 211 by being supplied with power. The power supplied to heater 214 is controlled by the controller 100.

Further, a flow path 215 through which a refrigerant flows is formed inside the stage 211. A chiller unit (not shown) is connected to the flow path 215 via a pipe 216a and a pipe 216b. The refrigerant, which is adjusted to a predetermined temperature by the chiller unit, is supplied to the flow path 215 via the pipe 216a. The refrigerant circulating in the flow path 215 is returned to the chiller unit via the pipe 216b. The stage 211 is cooled down by the refrigerant circulating in the flow path 215. The chiller unit is controlled by the controller 100.

The support 212 is arranged inside the lower container 201 so as to pass through an opening formed in the bottom of the lower container 201. The support 212 is moved up/down by driving of an elevating mechanism 240. The elevating mechanism 240 is an example of a driver. When the substrate W is loaded, the elevating mechanism 240 is driven to lower the support structure 210 to a transfer position where the substrate W is transferred, and the gate valve G is opened. Then, the substrate W is loaded into the lower container 201 by a transfer robot (not shown) via the opening 205 and is delivered onto lift pins (not shown) projecting above the stage 211. Then, the substrate W is placed on the stage 211 by lowering the lift pins (not shown). Then, the gate valve G is closed, and the elevating mechanism 240 is driven to raise the support structure 210 to a processing position where the substrate W is processed, so that a film-forming process is performed on the substrate W. Further, when the substrate W is unloaded, the elevating mechanism 240 is driven to lower the support structure 210, and the gate valve G is opened. Then, the substrate W is lifted up from the stage 211 by raising the lift pins (not shown). Then, the substrate W on the lift pins (not shown) is unloaded out of the lower container 201 via the opening 205 by the transfer robot (not shown).

The showerhead 230 is provided at a position facing the stage 211. The showerhead 230 includes a diffusion chamber 231a and a diffusion chamber 231b. The diffusion chamber 231a and the diffusion chamber 231b are not in communication with each other. A gas supplier 220 is connected to the diffusion chambers 231a and 231b. Specifically, a valve 224a, an MFC (Mass Flow Controller) 223a, a vaporizer 222a, and a raw material source 221a are connected to the diffusion chamber 231a via a pipe 225a. The raw material source 221a is a source of isocyanate which is an example of a first monomer. The vaporizer 222a vaporizes liquid of the isocyanate supplied from the raw material source 221a. The MFC 223a controls a flow rate of vapor of the isocyanate vaporized by the vaporizer 222a. The valve 224a controls the supply and cutoff of the isocyanate vapor to the pipe 225a.

A valve 224b, an MFC 223b, a vaporizer 222b, and a raw material source 221b are connected to the diffusion chamber 231b via a pipe 225b. The raw material source 221b is a source of amine which is an example of a second monomer. The vaporizer 222b vaporizes liquid of the amine supplied from the raw material source 221b. The MFC 223b controls a flow rate of amine vapor vaporized by vaporizer 222b. The valve 224b controls the supply and cutoff of the amine vapor to the pipe 225b. The isocyanate vapor and the amine vapor are examples of a processing gas.

Further, a valve 224c, an MFC 223c, and a cleaning gas source 221c are connected to the showerhead 230 via pipes 225a and 225b. The cleaning gas source 221c is a source of a cleaning gas containing molecules including, for example, oxygen atoms or fluorine atoms. The MFC 223c controls a flow rate of the cleaning gas supplied from the cleaning gas source 221c. The valve 224c controls the supply and cutoff of the cleaning gas to the pipes 225a and 225b.

The diffusion chamber 231a is in communication with the processing space $S_P$ via a plurality of discharge ports 232a, and the diffusion chamber 231b is in communication with the processing space $S_P$ via a plurality of discharge ports 232b. A gas supplied into the diffusion chamber 231a via the pipe 225a diffuses inside the diffusion chamber 231a and is discharged into the processing space $S_P$ in the form of a shower via the discharge ports 232a. Further, a gas supplied into the diffusion chamber 231b via the pipe 225b diffuses inside the diffusion chamber 231b and is discharged into the processing space $S_P$ in the form of a shower via the discharge ports 232b. The isocyanate vapor and the amine vapor are separately discharged into the processing space $S_P$ via the discharge ports 232a and the discharge ports 232b, respectively, and are mixed with each other inside the processing space $S_P$ to form a polymer organic film having a urea bond on the surface of the substrate W placed on the stage 211.

For example, linear polyurea may be produced by using diisocyanate as the first monomer and diamine (for example, primary amine) as the second monomer. A combination of diisocyanate and diamine is, for example, a combination of 4,4'-diphenylmethanediisocyanate (MDI) and 1,12-diaminododecane (DAD). The combination of diisocyanate and diamine is, for example, a combination of 1,3-bis (isocyanatemethyl)cyclohexane (H6XDI) and 1,12-diaminododecane (DAD). The combination of diisocyanate and diamine is, for example, a combination of 1,3-bis (isocyanatemethyl)cyclohexane (H6XDI) and 1,3-bis(aminomethyl)cyclohexane (H6XDA). The combination of diisocyanate and diamine is, for example, a combination of 1,3-bis(isocyanatemethyl)cyclohexane (H6XDI) and hexamethylenediamine (HMDA). The combination of diisocyanate and diamine is, for example, a combination of m-xylylenediisocyanate (XDI) and m-xylylenediamine (XDA). The combination of diisocyanate and diamine is, for example, a combination of m-xylylenediisocyanate (XDI) and benzylamine (BA).

For example, cross-linkable polyurea may be produced by using diisocyanate as the first monomer and triamine (for example, primary amine) or tetraamine (for example, secondary amine) as the second monomer. Further, trimer having a urea bond may be produced by using monoisocyanate as the first monomer and diamine (for example, primary amine) as the second monomer. Further, dimer having a urea bond may be produced by using monoisocyanate as the first monomer and monoamine (for example, primary amine) as the second monomer.

An RF power supply 260 that supplies RF (Radio Frequency) power for plasma generation is connected to the showerhead 230 via a matching device 261. The showerhead 230 functions as a cathode electrode for the stage 211. In cleaning the interior of the processing container 209, a cleaning gas is supplied from the gas supplier 220 into the processing space $S_P$ via the showerhead 230, and the RF power is supplied into the processing space $S_P$ from the RF power supply 260 via the matching device 261. As a result, the cleaning gas is plasmarized inside the processing space $S_P$, and the interior of the processing container 209 is cleaned by active species contained in the plasma.

A valve 224d, an MFC 223d, and a purge gas source 221d are connected to the lower container 201 below the stage 211 via a pipe 225d. The purge gas source 221d is a source of a purge gas. The purge gas is, for example, an inert gas such as a nitrogen gas or a noble gas. The MFC 223d controls a flow rate of the purge gas supplied from the purge gas source 221d. The valve 224d controls the supply and cutoff of the purge gas to the pipe 225d. A space inside the lower container 201 below the stage 211 is defined as a lower space $S_L$. By supplying the purge gas into the lower space $S_L$, it is possible to suppress a film-forming gas supplied into the processing space $S_P$ from entering the lower space $S_L$.

The controller 100 includes a memory, a processor, and an input/output interface. The memory stores a control program, a process recipe, and the like. The processor reads out and executes the control program from the memory and controls each part of the apparatus main body 200 through the input/output interface based on the recipe stored in the memory.

[Structure Near Periphery of Stage 211]

Figures 2, 3:
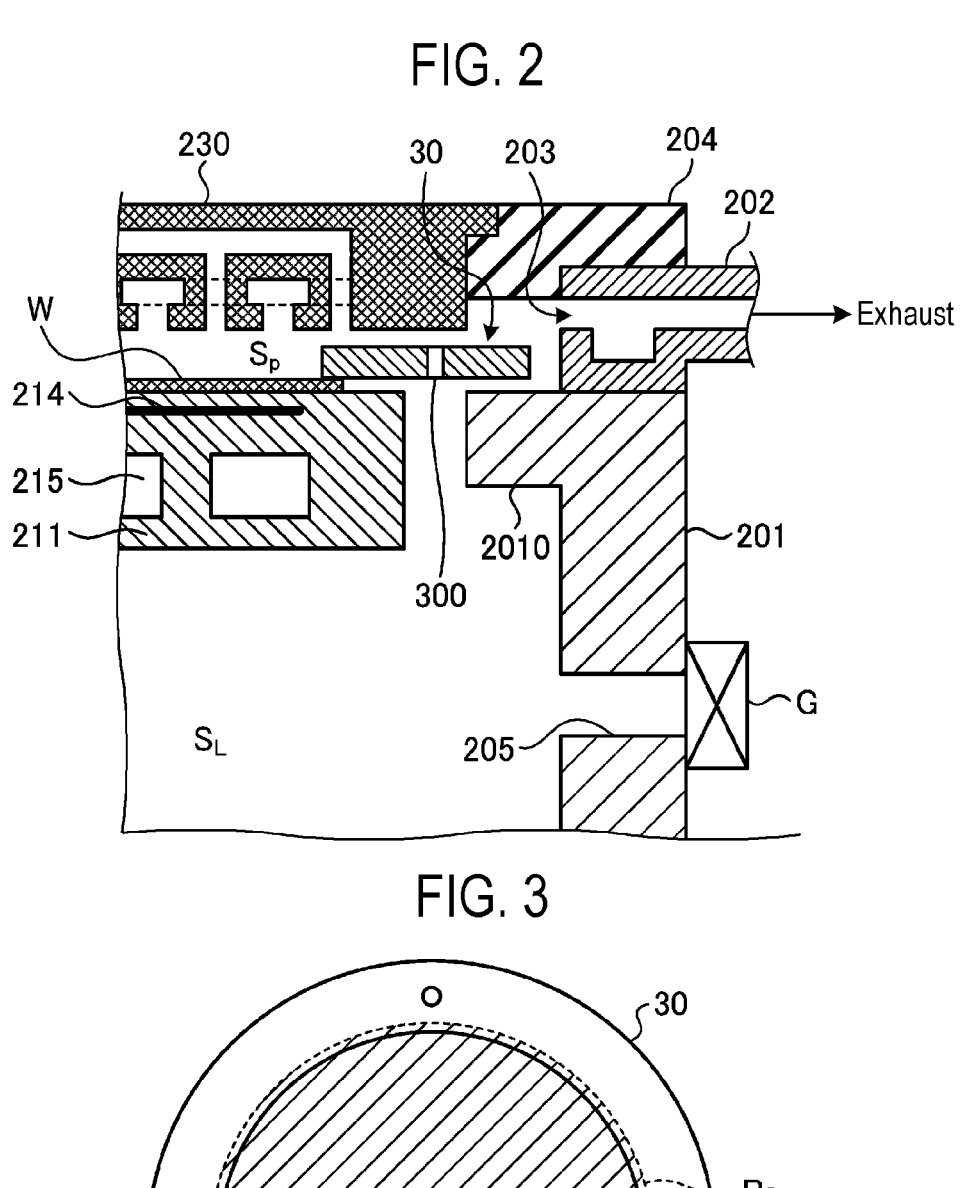
FIG. 2 is an enlarged cross-sectional view showing an example of a structure near a periphery of a stage according to a first embodiment.
FIG. 3 is a plan view showing an example of a shape and arrangement of through-holes formed in a clamp ring in the first embodiment.

FIG. 2 is an enlarged cross-sectional view showing an example of a structure near a periphery of the stage 211 in the first embodiment. In FIG. 2, a state when the stage 211 is at the processing position is shown. An annular clamp ring 30 is provided above the stage 211 and on the periphery of the substrate W placed on the stage 211 so as to cover the periphery of the substrate W. The clamp ring 30 is supported by a shelf 2010 provided on the sidewall of the lower container 201 when the stage 211 is at the transfer position. One or more through-holes 300 are formed in the clamp ring 30 along a thickness direction of the clamp ring 30. The through-holes 300 are an example of a pressure regulating mechanism.

The clamp ring 30 is supported by the periphery of the substrate W on the stage 211 when the stage 211 rises from the transfer position to the processing position and, for example, as shown in FIG. 2, is separated from the shelf 2010 of the lower container 201. In this state, the film-forming process is performed on the substrate W.

In the film-forming process, the processing gas supplied into the processing space $S_P$ is exhausted from the exhaust port 203 through a space between a lower surface of the showerhead 230 and an upper surface of the clamp ring 30. On the other hand, the purge gas supplied into the lower space $S_L$ below the stage 211 is exhausted from the exhaust port 203 through a space between a lower surface of the clamp ring 30 and an upper surface of the shelf 2010. As a result, the processing gas supplied into the processing space $S_P$ is suppressed from entering below the stage 211 through the space between the lower surface of the clamp ring 30 and the upper surface of the shelf 2010.

A portion of the purge gas supplied into the lower space $S_L$ also flows upward through the clamp ring 30 via the through-holes 300 of the clamp ring 30. As a result, the processing gas supplied into the processing space $S_P$ is prevented from entering below the stage 211 via the through-holes 300.

Here, for example, as shown in FIG. 3, the through-holes 300 of the clamp ring 30 are arranged outside a region Rs where the discharge ports 232a and the discharge ports 232b to which the processing gas is supplied are arranged in a plan view. FIG. 3 is a plan view showing an example of a shape and arrangement of the through-holes formed in the clamp ring in the first embodiment. As described above, by arranging the through-holes 300 outside the region Rs where the discharge ports 232a and the discharge ports 232b are arranged in a plan view, the purge gas flowing upward through the clamp ring 30 via the through-holes 300 is less likely to be introduced into the processing space $S_P$. This makes it possible to suppress lowering of a concentration of the processing gas supplied into the processing space $S_P$ due to the introduction of the purge gas, and to prevent lengthening the time required for processing the substrate W.

Figures 4, 5:
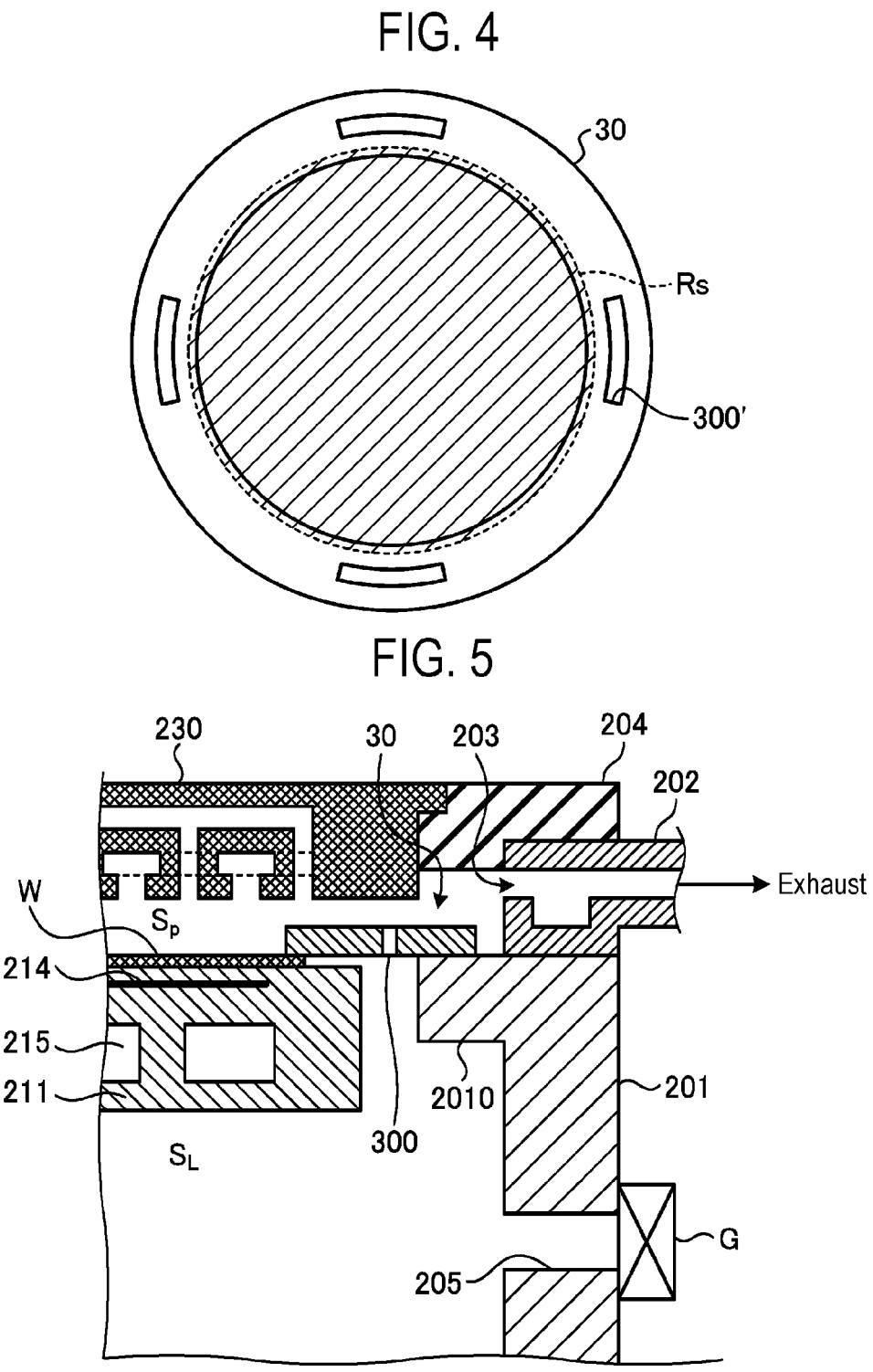
FIG. 4 is a plan view showing another example of the shape and arrangement of the through-holes formed in the clamp ring in the first embodiment.
FIG. 5 is an enlarged cross-sectional view showing an example of a positional relationship between the stage and the clamp ring when the stage descends in the first embodiment.

Although four through-holes 300 have been shown to be formed in the clamp ring 30 in the example of FIG. 3, the disclosed technique is not limited thereto. The number of through-holes 300 formed in the clamp ring 30 may be less than four or more than four. Further, in the example of FIG. 3, the shape of an opening of each through-hole 300 is substantially circular, but the disclosed technique is not limited thereto. The shape of the opening of each through-hole 300 may be a polygonal or oval shape. Further, as shown in FIG. 4, for example, the shape of the opening of each through-hole 300 may be an elongated shape along an extension direction of the clamp ring 30.

When the film-forming process on the substrate W is completed, the supply of the processing gas into the processing space $S_P$ is stopped and the processing gas inside the processing space $S_P$ is exhausted through the exhaust port 203. This reduces the internal pressure of the processing space $S_P$. In this state, when the stage 211 descends to unload the substrate W, for example, as shown in FIG. 5, the lower surface of the clamp ring 30 is brought into contact with the upper surface of the shelf 2010. As a result, a closed space is formed by the substrate W, the clamp ring 30, the showerhead 230, the insulating member 204, the exhaust duct 202, and the shelf 2010.

However, the purge gas flows through the through-holes 300 into the closed space formed by the substrate W, the clamp ring 30, the showerhead 230, the insulating member 204, the exhaust duct 202, and the shelf 2010. This suppresses a pressure difference between the interior of the processing space $S_P$ and the interior of the lower space $S_L$. As a result, the substrate W moves downward as the stage 211 descends without coming into close contact with the clamp ring 30. Thus, the substrate W after processing may be quickly unloaded.

Figures 6, 7:
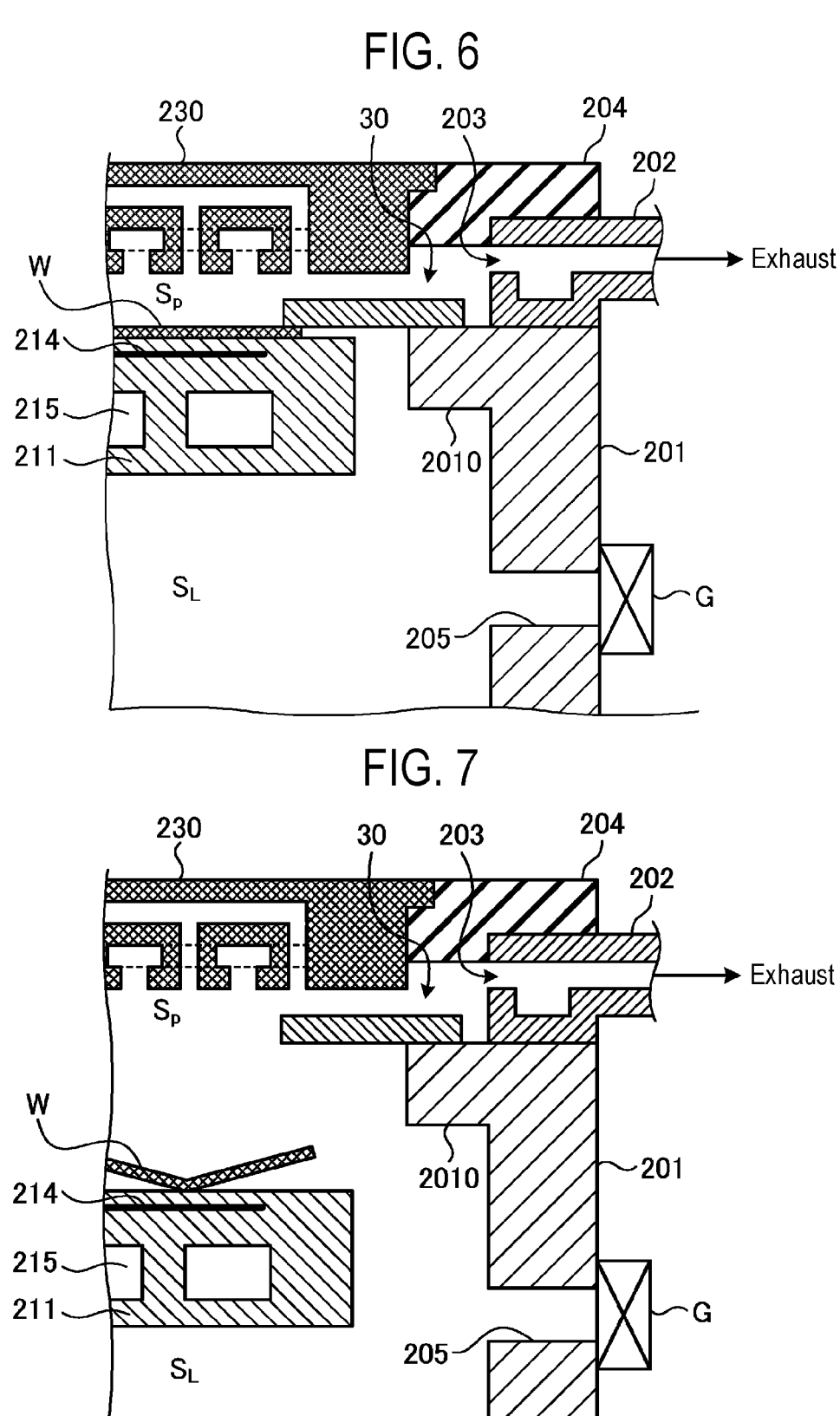
FIG. 6 is an enlarged cross-sectional view showing an example of a positional relationship between a stage and a clamp ring when the stage descends in a Comparative Example.
FIG. 7 is an enlarged cross-sectional view showing an example of a state in which a substrate is damaged in the Comparative Example.

Here, a case where the through-holes 300 are not formed in the clamp ring 30 is considered. FIG. 6 is an enlarged cross-sectional view showing an example of a positional relationship between the stage 211 and the clamp ring 30 when the stage 211 descends in Comparative Example. When the stage 211 descends to unload the substrate W after processing, for example, as shown in FIG. 6, the closed space is formed by the substrate W, the clamp ring 30, the showerhead 230, the insulating member 204, the exhaust duct 202, and the shelf 2010.

In the Comparative Example of FIG. 6, since the through-holes 300 are not formed in the clamp ring 30, when a gas in the closed space is exhausted from the exhaust port 203, the internal pressure of the processing space $S_P$ further decreases. When the internal pressure of the processing space $S_P$ decreases, the substrate W is attracted to the processing space $S_P$ and comes into close contact with the clamp ring 30 due to the pressure difference between the processing space $S_P$ and the lower space $S_L$. When the stage 211 further descends while the substrate W is in close contact with the clamp ring 30, the substrate W is separated from the stage 211. Then, leakage of the purge gas from between the substrate W and the clamp ring 30 and from between the clamp ring 30 and the shelf 2010 progresses, and when the pressure difference between the processing space $S_P$ and the lower space $S_L$ becomes lower than a predetermined value, the substrate W is separated from the clamp ring 30 and drops onto the stage 211. As a result, for example, as shown in FIG. 7, the substrate W may be damaged.

Therefore, in the Comparative Example, damage to the substrate W is avoided by waiting for the stage 211 to descend until the pressure difference between the processing space $S_P$ and the lower space $S_L$ becomes lower than the predetermined value. In this case, a throughput in processing the substrates W is reduced.

In contrast, in the present embodiment, the through-holes 300 are formed in the clamp ring 30. Therefore, even when the closed space is formed by the substrate W, the clamp ring 30, the showerhead 230, the insulating member 204, the exhaust duct 202, and the shelf 2010 as the stage 211 descends, the purge gas flows into the closed space through the through-holes 300. This suppresses the pressure difference between the interior of the processing space $S_P$ and the interior of the lower space $S_L$. As a result, the substrate W may be rapidly lowered together with the stage 211 while preventing the substrate W from coming into close contact with the clamp ring 30, so that the substrate W after processing may be quickly unloaded. Therefore, the throughput in processing the substrates W may be improved.

The first embodiment has been described above. As described above, the substrate processing apparatus 10 in the present embodiment includes the processing container 209, the stage 211, the exhaust port 203, the elevating mechanism 240, the clamp ring 30, and the pressure regulating mechanism. The stage 211 is provided inside the processing container 209, and the substrate W is placed on the stage 211. The exhaust port 203 is arranged around the stage 211 along the inner wall of the processing container 209. The elevating mechanism 240 moves the stage 211 up and down between the processing position where the substrate W placed on the stage 211 is processed, and the transfer position that is lower than the processing position and is a position when the substrate W is loaded onto the stage 211 and when the substrate W is unloaded from the stage. The clamp ring 30 is arranged on the peripheral edge of the substrate W on the stage 211 to cover the peripheral edge of the substrate W when the stage 211 is at the processing position. When the stage 211 is at the transfer position, the clamp ring 30 is supported on the shelf 2010 which is provided on the sidewall of the processing container 209. The pressure regulating mechanism suppresses the pressure difference between the processing space $S_P$ above the substrate W on the stage 211 and the lower space $S_L$ below the stage 211. As a result, the substrate W after processing may be quickly unloaded.

In the above-described embodiment, the pressure regulating mechanism is the through-holes 300 formed along the thickness direction of the clamp ring 30. This makes it possible to easily configure the pressure regulating mechanism.

Further, the substrate processing apparatus 10 in the above-described embodiment includes the showerhead 230 that is provided in the upper portion of the processing container 209 and supplies the processing gas for processing the substrate W on the stage 211 from the discharge ports 232a and 232b provided on the lower surface of the showerhead 230 into the processing container 209. The through-holes 300 are formed in a region outside the region where the discharge ports 232a and the discharge ports 232b are provided in a plan view. This makes it difficult for the purge gas flowing upward through the clamp ring 30 via the through-holes 300 to be introduced into the processing space $S_P$. As a result, it is possible to prevent lowering of the concentration of the processing gas supplied into the processing space $S_P$ due to the introduction of the purge gas and to prevent lengthening of the time required for processing the substrate W.

Further, in the above-described embodiment, the purge gas is supplied to the lower space $S_L$ below the stage 211. This makes it possible to suppress deposits from adhering to members arranged in the lower space $S_L$, the back surface of the substrate W, and the like.

Second Embodiment

In the first embodiment, the purge gas flows upward through the clamp ring 30 via the through-holes 300 even while the substrate W is being processed. In contrast, a second embodiment is different from the first embodiment in that the opening of the through-holes 300 is blocked when the stage 211 is at the processing position, and the opening of the through-holes 300 is opened when the stage 211 moves below the processing position. The following description will be focused on the differences from the first embodiment.

Figures 8, 9:
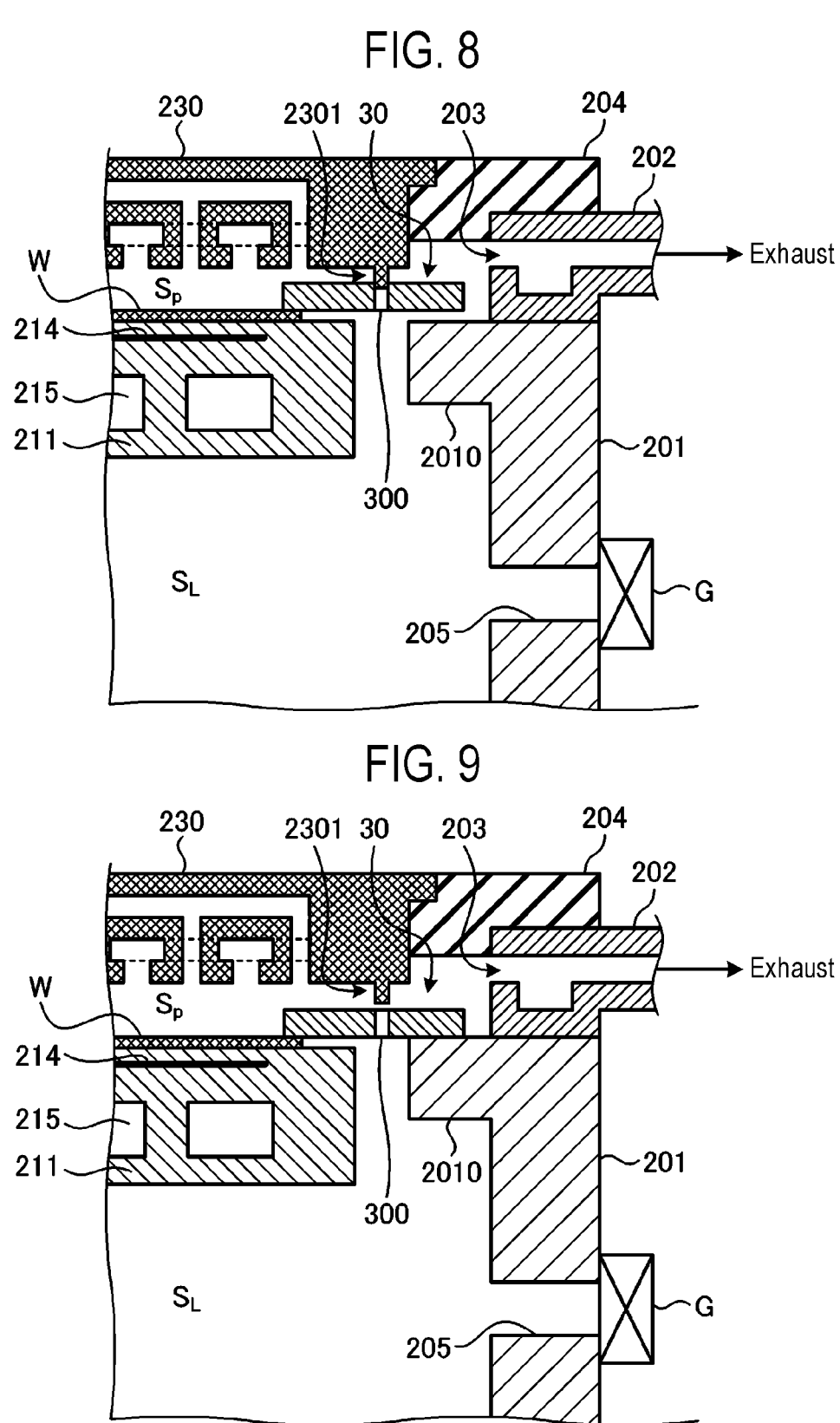
FIG. 8 is an enlarged cross-sectional view showing an example of a structure near a periphery of a stage according to a second embodiment.
FIG. 9 is an enlarged cross-sectional view showing an example of a positional relationship between a convex portion and a through-hole when the stage descends in the second embodiment.

FIG. 8 is an enlarged cross-sectional view showing an example of a structure near a periphery of the stage 211 in the second embodiment. In FIG. 8, a state when the stage 211 is at the processing position is shown. In the present embodiment, for example, as shown in FIG. 8, a convex portion 2301 that protrudes from the showerhead 230 toward the clamp ring 30 is formed on the lower surface of the showerhead 230. The showerhead 230 is an example of the upper portion of the processing container 209. The convex portion 2301 is formed at a position corresponding to the through-holes 300 of the clamp ring 30. When the stage 211 is at the processing position, for example, as shown in FIG. 8, the opening of the through-hole 300 is blocked by the convex portion 2301. As a result, it is more difficult for the purge gas to be introduced into the processing space $S_P$ via the through-holes 300 when the substrate W is processed. Therefore, it is possible to further prevent lengthening of the time required for processing the substrate W.

Further, when the processing on the substrate W is completed and the substrate W is unloaded, for example, as shown in FIG. 9, the convex portion 2301 of the showerhead 230 and the opening of the through-hole 300 are separated from each other as the stage 211 descends. As a result, the opening of the through-hole 300 is opened, and the purge gas flows upward through the clamp ring 30 via the through-hole 300. Therefore, even when the stage 211 descends to form the closed space by the substrate W, the clamp ring 30, the showerhead 230, the insulating member 204, the exhaust duct 202, and the shelf 2010, the pressure difference between the processing space $S_P$ and the lower space $S_L$ is suppressed. This makes it possible to move the substrate W downward as the stage 211 descends while preventing the substrate W from coming into close contact with the clamp ring 30.

Figure 10:
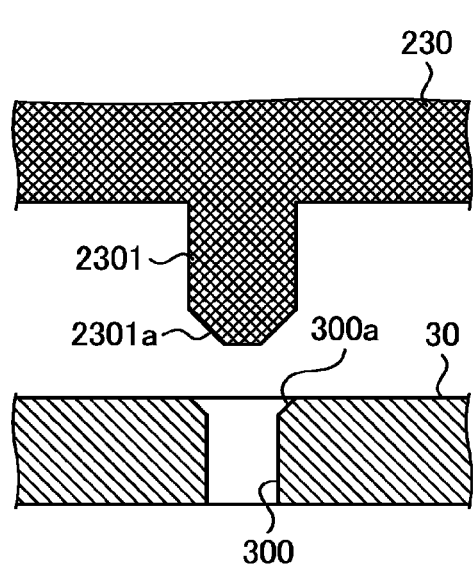
FIG. 10 is an enlarged cross-sectional view showing an example of a shape of the convex portion and the through-hole in the second embodiment.

Further, for example, as shown in FIG. 10, a tapered portion 2301a may be formed at a leading end of the convex portion 2301 of the showerhead 230. Further, for example, as shown in FIG. 10, a tapered portion 300a may be formed at the opening of the through-hole 300. With this configuration, even if the convex portion 2301 and the through-hole 300 are slightly misaligned from each other, the opening of the through-hole 300 may be blocked by the convex portion 2301.

Further, in the present embodiment, the opening of the through-hole 300 is blocked by inserting at least a portion of the convex portion 2301 into the through-holes 300, but the disclosed technique is not limited thereto. For example, the convex portion 2301 may have a shape having a cross section of a region larger than the region of the opening of the through-hole 300. In this case, the convex portion 2301 is arranged at a position where the region of the opening of the through-hole 300 is included in the region of the cross section of the convex portion 2301 in a plan view. As a result, the opening of the through-hole 300 is blocked by the convex portion 2301 due to the contact between the convex portion 2301 and the clamp ring 30.

The second embodiment has been described above. As described above, in the present embodiment, the convex portion 2301 projecting downward from the upper portion of the processing container 209 is provided in the upper portion of the processing container 209. The convex portion 2301 blocks the opening of the through-hole 300 by being inserted into the apparatus main body 200 of the clamp ring 30 when the stage 211 is at the processing position. Further, when the stage 211 moves from the processing position to the transfer position, the convex portion 2301 is separated from the through-hole 300 of the clamp ring 30 to open the opening of the through-hole 300. As a result, it is more difficult for the purge gas to be introduced into the processing space $S_P$ via the through-hole 300 when the substrate W is processed, which makes it possible to further prevent lengthening of the time required for processing the substrate W.

Third Embodiment

In the first embodiment, the purge gas flows upward through the clamp ring 30 via the through-holes 300 formed in the clamp ring 30, thereby suppressing the pressure difference between the processing space $S_P$ and the lower space $S_L$. In contrast, a third embodiment is different from the first embodiment in that a gap is formed between the shelf 2010 of the lower container 201 and the clamp ring 30 and the pressure difference between the processing space $S_P$ and the lower space $S_L$ is suppressed with the gap. The following description will be focused on the differences from the first embodiment.

Figure 11:
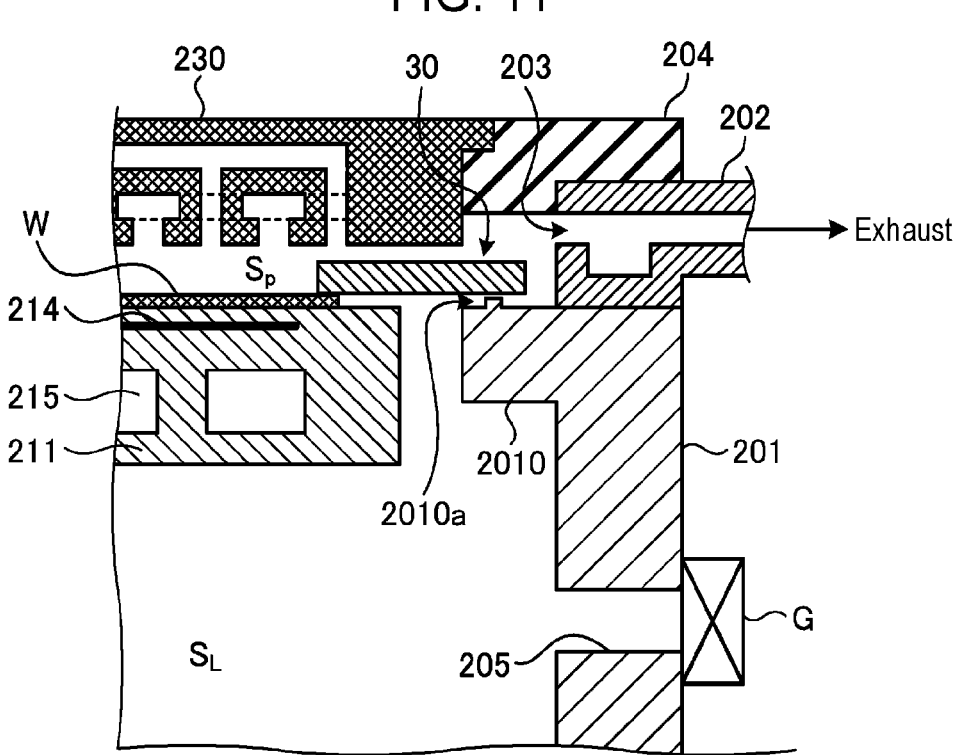
FIG. 11 is an enlarged cross-sectional view showing an example of a structure near a periphery of a stage according to a third embodiment.

FIG. 11 is an enlarged cross-sectional view showing an example of a structure near a periphery of the stage 211 in the third embodiment. In FIG. 11, a state when the stage 211 is at the processing position is shown. In the present embodiment, for example, as shown in FIG. 11, a convex portion 2010a that protrudes from the shelf 2010 toward the showerhead 230 is formed on the upper surface of the shelf 2010. For example, three or more convex portions 2010a are formed on the upper surface of the shelf 2010 along the clamp ring 30. When the stage 211 is at the processing position, for example, as shown in FIG. 11, the clamp ring 30 and the convex portion 2010a are separated from each other. In the present embodiment, since the through-holes 300 are not formed in the clamp ring 30, it is difficult for the purge gas to be introduced into the processing space $S_P$ when the substrate W is processed. Therefore, it is possible to prevent lengthening of the time required for processing the substrate W.

Figure 12:
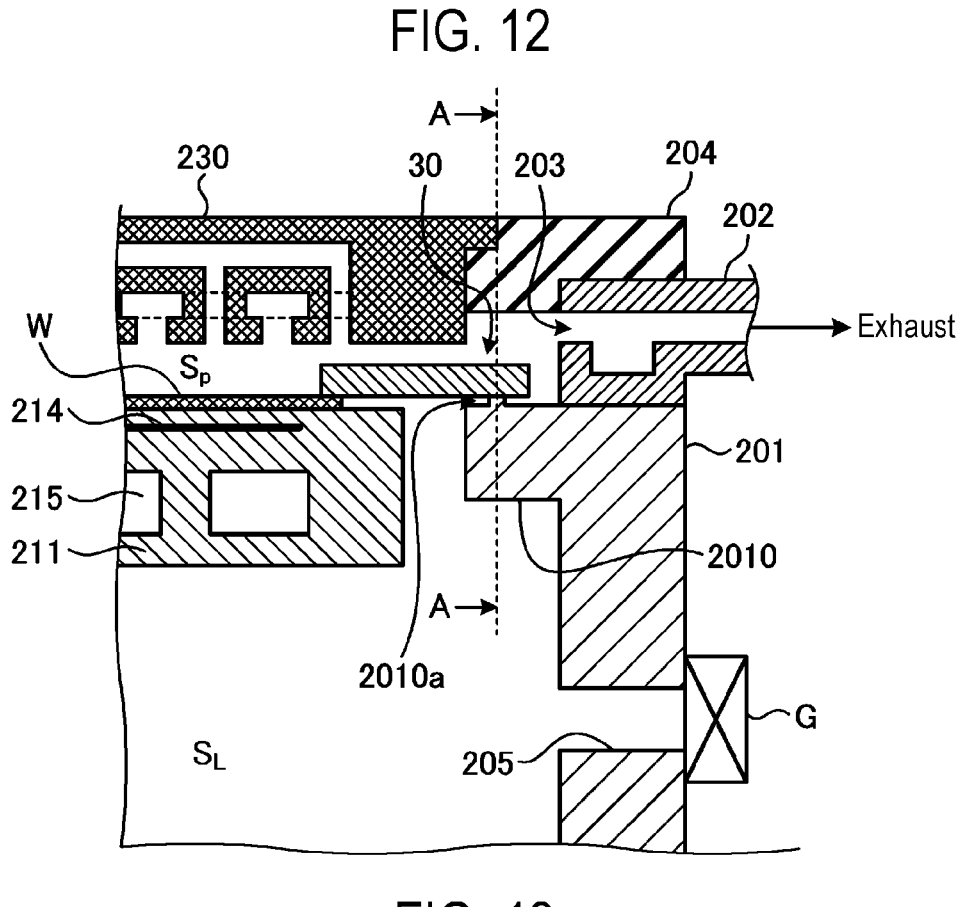
FIG. 12 is an enlarged cross-sectional view showing an example of a positional relationship between the stage and a clamp ring when the stage descends in the third embodiment.
Figure 13:
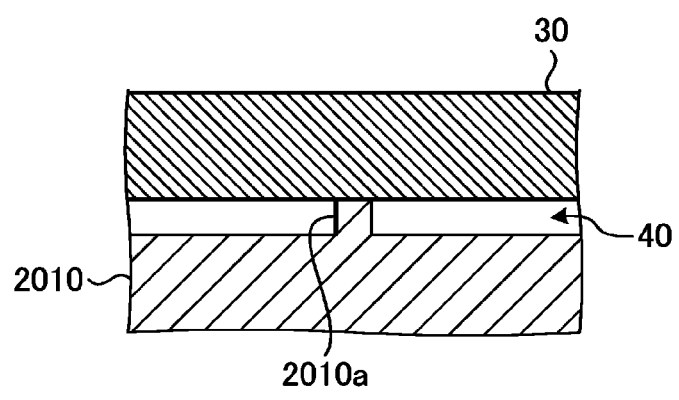
FIG. 13 is an enlarged cross-sectional view showing an example of a cross-section taken along line A-A in FIG. 12.

When the processing on the substrate W is completed and the substrate W is unloaded, for example, as shown in FIG. 12, the stage 211 descends to allow the clamp ring 30 and the convex portion 2010a to be brought into contact with each other, and the clamp ring 30 is supported by a support structure 2101a. A cross-section taken along line A-A in FIG. 12 is as shown in, for example, FIG. 13. As shown in FIG. 13, a gap 40 is formed between the clamp ring 30 and the shelf 2010 by the convex portion 2010a. The gap 40 formed between the clamp ring 30 and the shelf 2010 by the convex portion 2010a is an example of a pressure regulating mechanism. Through the gap 40, the purge gas inside the lower space $S_L$ flows into the processing space $S_P$. As a result, the pressure difference between the processing space $S_P$ and the lower space $S_L$ is suppressed.

The third embodiment has been described above. As described above, in the present embodiment, the convex portion 2010a is provided on the upper surface of the shelf 2010, and the clamp ring 30 is supported by the convex portion 2010a when the stage 211 moves from the processing position to the transfer position, thereby forming the gap 40 between the lower surface of the clamp ring 30 and the upper surface of the shelf 2010. This makes it possible to easily suppress the pressure difference between the processing space $S_P$ and the lower space $S_L$.

Fourth Embodiment

In the third embodiment, the gap 40 is formed between the clamp ring 30 and the shelf 2010 by the convex portion 2010a formed on the shelf 2010. In contrast, a fourth embodiment is different from the third embodiment in that the gap 40 is formed between the clamp ring 30 and the shelf 2010 by forming a groove in the shelf 2010. The following description will be focused on the differences from the third embodiment.

Figure 14:
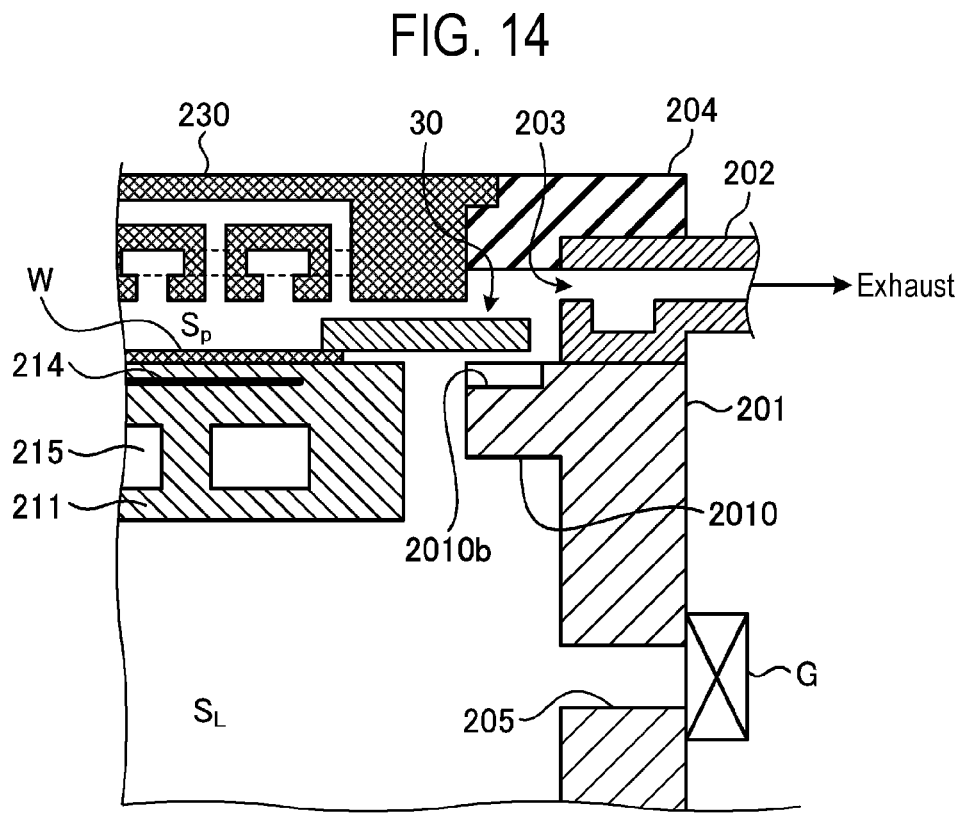
FIG. 14 is an enlarged cross-sectional view showing an example of a structure near a periphery of a stage according to a fourth embodiment.
Figure 15:
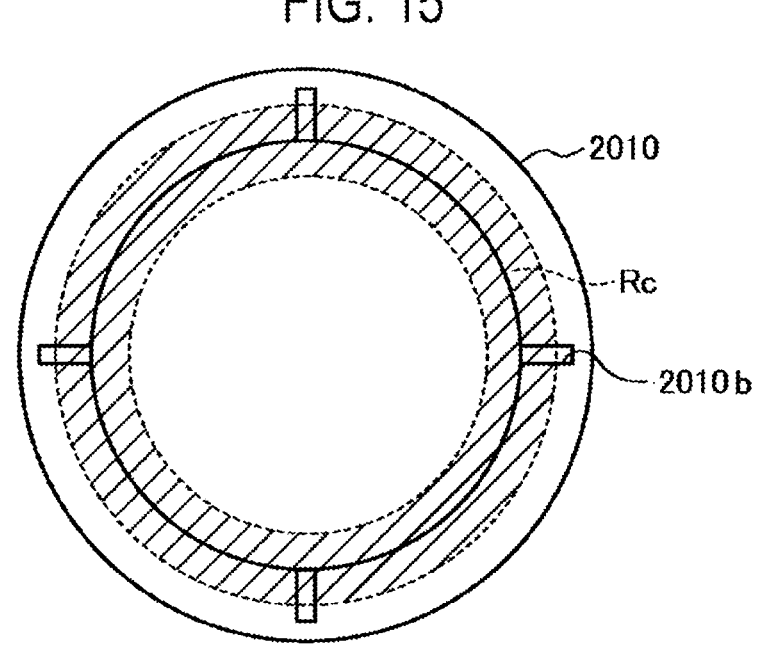
FIG. 15 is a plan view showing an example of a shape and arrangement of grooves formed in a shelf in the fourth embodiment.

FIG. 14 is an enlarged cross-sectional view showing an example of a structure near a periphery of the stage 211 in the fourth embodiment. In FIG. 14, a state when the stage 211 is at the processing position is shown. In the present embodiment, for example, as shown in FIG. 14, a groove 2010b is formed in the upper surface of the shelf 2010. For example, as shown in FIG. 15, the groove 2010b is formed on the upper surface of the shelf 2010 so as to extend outward beyond a region Rc of the clamp ring 30 in a plan view.

When the stage 211 is at the processing position, for example, as shown in FIG. 14, the clamp ring 30 and the shelf 2010 are separated from each other. In the present embodiment, since the through-holes 300 are not formed in the clamp ring 30, it is difficult for the purge gas to enter the processing space $S_P$ when the substrate W is processed. Therefore, it is possible to prevent lengthening of the time required for processing the substrate W.

Figures 16, 17:
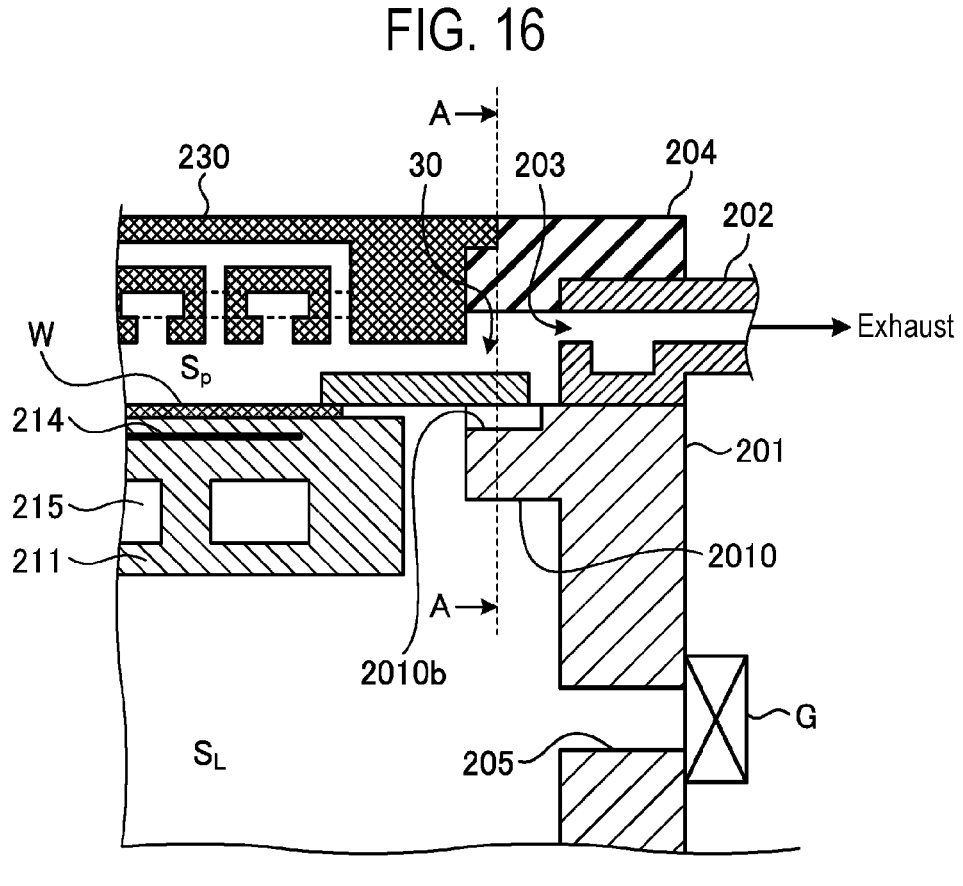
FIG. 16 is an enlarged cross-sectional view showing an example of a positional relationship between the stage and a clamp ring when the stage descends in the fourth embodiment.
FIG. 17 is an enlarged cross-sectional view showing an example of a positional relationship between a groove and the clamp ring.

When the processing on the substrate W is completed and the substrate W is unloaded, the stage 211 descends so that, for example, as shown in FIG. 16, the clamp ring 30 and the shelf 2010 come into contact with each other and the clamp ring 30 is supported by a support structure 2101. A cross section taken along line A-A in FIG. 16 is as shown in, for example, FIG. 17. As shown in FIG. 17, a gap 40 is formed between the clamp ring 30 and the shelf 2010 by the groove 2010b. The gap 40 formed between the clamp ring 30 and the shelf 2010 by the groove 2010b is an example of a pressure regulating mechanism. The gap 40 allows the purge gas in the lower space $S_L$ to flow into the processing space $S_P$, thereby suppressing the pressure difference between the processing space $S_P$ and the lower space $S_L$.

The fourth embodiment has been described above. As described above, in the present embodiment, the groove 2010b that extends outward beyond the region of the clamp ring 30 in a plan view is formed in the upper surface of the shelf 2010. Further, the gap 40 is formed between the lower surface of the clamp ring 30 and the groove 2010b of the shelf 2010 when the stage 211 moves from the processing position to the transfer position. This makes it possible to easily suppress the pressure difference between the processing space $S_P$ and the lower space $S_L$.

Fifth Embodiment

In the fourth embodiment, the purge gas in the lower space $S_L$ flows into the processing space $S_P$ via the gap 40 formed between the clamp ring 30 and the shelf 2010 by the groove 2010b formed in the shelf 2010. In contrast, a fifth embodiment is different from the fourth embodiment in that a pipe is formed inside the shelf 2010 to allow the purge gas in the lower space $S_L$ to flow into the processing space $S_P$ via the pipe. The following description will be focused on the differences from the fourth embodiment.

Figure 18:
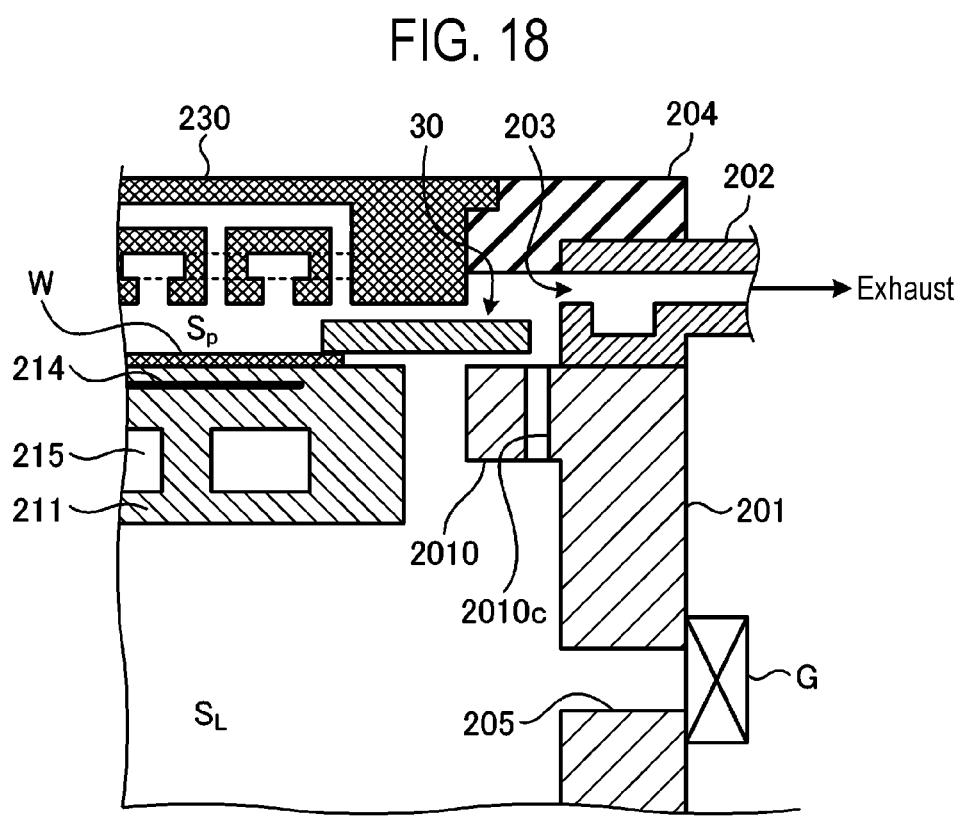
FIG. 18 is an enlarged cross-sectional view showing an example of a structure near a periphery of a stage in a fifth embodiment.

FIG. 18 is an enlarged cross-sectional view showing an example of a structure near a periphery of the stage 211 in the fifth embodiment. In FIG. 18, a state when the stage 211 is at the processing position is shown. In the present embodiment, for example, as shown in FIG. 18, a pipe 2010c is provided inside the shelf 2010. The pipe 2010c communicates between a space above the shelf 2010 and a space below the shelf 2010. The pipe 2010c is provided inside the shelf 2010 such that an opening of the pipe 2010c is arranged outside a region where the clamp ring 30 is arranged in a plan view. As a result, even when the stage 211 descends and the clamp ring 30 is supported by the shelf 2010, the purge gas in the lower space $S_L$ may flow into the processing space $S_P$ via the pipe 2010c. This makes it possible to easily suppress the pressure difference between the processing space $S_P$ and the lower space $S_L$.

Figure 19:
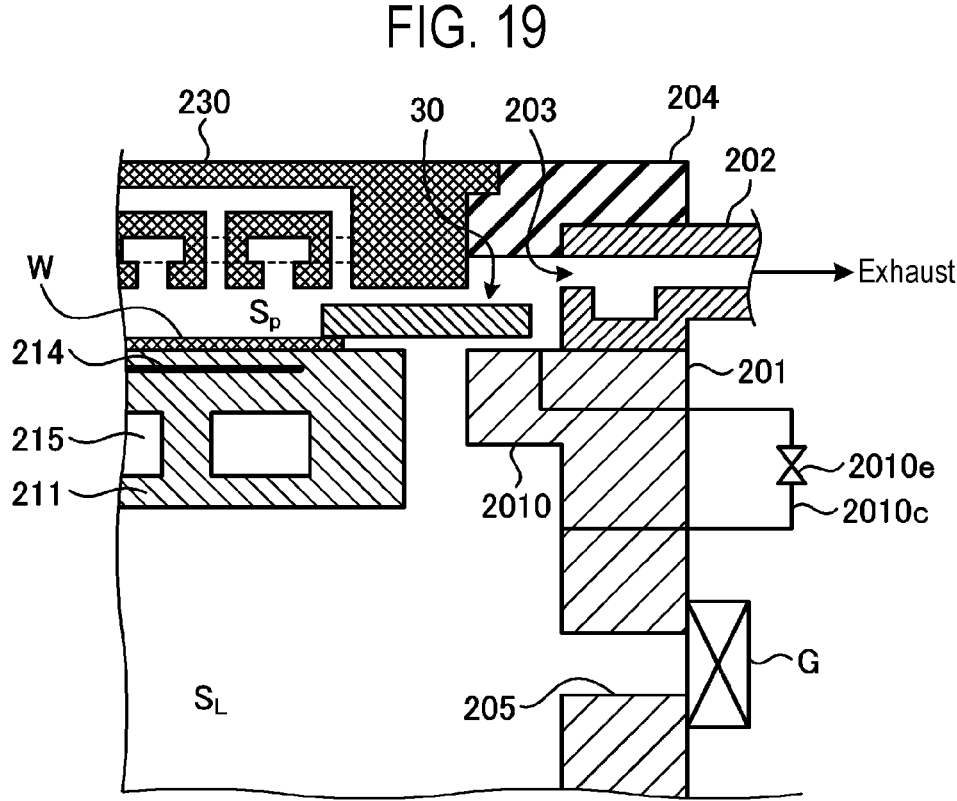
FIG. 19 is an enlarged cross-sectional view showing another example of the structure near the periphery of the stage in the fifth embodiment.

Further, for example, as shown in FIG. 19, a valve 2010e may be provided in the pipe 2010c communicating between the space above the shelf 2010 and the space below the shelf 2010. The valve 2010e is closed when the stage 211 is at the processing position, and is opened when the stage 211 moves from the processing position to the transfer position. The valve 2010e is controlled by the controller 100. As the valve 2010e is closed when the stage 211 is at the processing position, it is possible to prevent the purge gas from being excessively supplied above the shelf 2010 and prevent a portion of the purge gas from entering the processing space $S_P$. Further, by opening the valve 2010e when the substrate W is unloaded, it is possible to easily suppress the pressure difference between the processing space $S_P$ and the lower space $S_L$.

Figure 20:
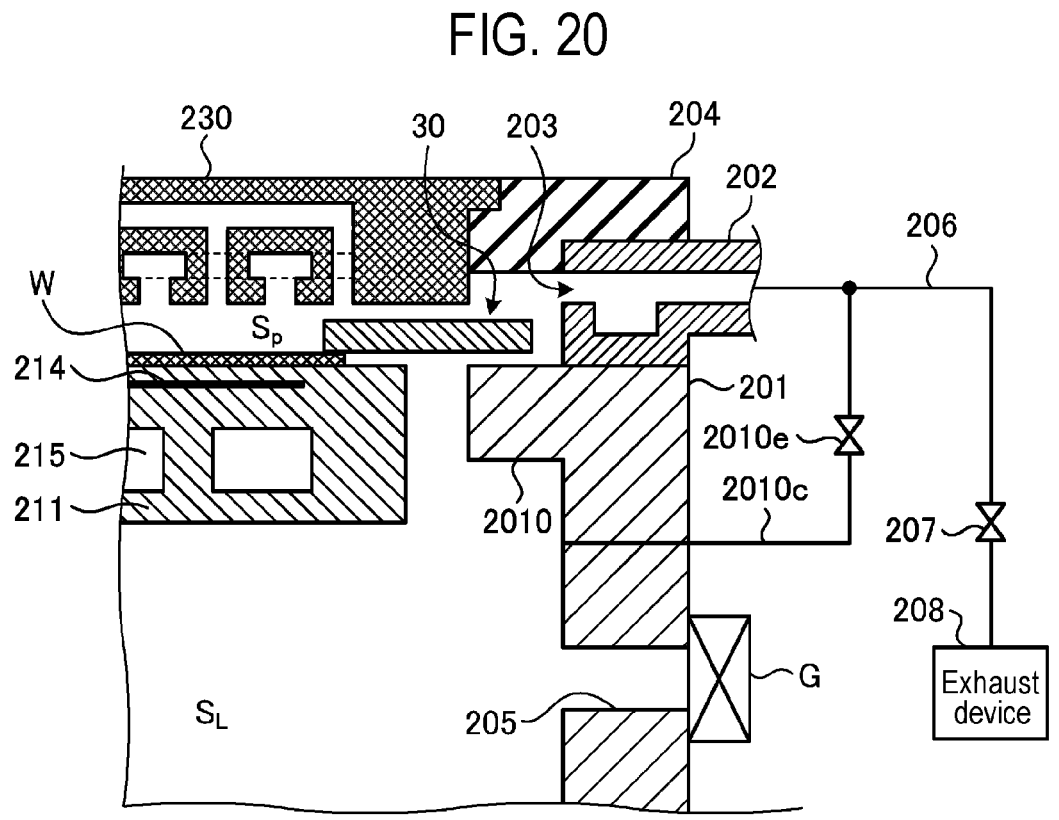
FIG. 20 is an enlarged cross-sectional view showing still another example of the structure near the periphery of the stage in the fifth embodiment.

Further, the pipe 2010c in the present embodiment communicates between the space above the shelf 2010 and the space below the shelf 2010, but the disclosed technique is not limited thereto. As another aspect, for example, as shown in FIG. 20, the pipe 2010c may communicate between the space below the shelf 2010 and the exhaust pipe 206. In this case, the pipe 2010c may be provided with a valve 2010e that is closed when the stage 211 is at the processing position and is opened when the stage 211 moves from the processing position to the transfer position. Even with such a configuration, it is possible to easily suppress the pressure difference between the processing space $S_P$ and the lower space $S_L$ when the substrate W is unloaded.

[Others]

The technique disclosed in the present disclosure is not limited to the above-described embodiments, but various modifications may be made within the scope of the gist thereof.

For example, in the above-described third and fourth embodiments, the gap 40 is formed between the clamp ring 30 and the shelf 2010 by providing the convex portion 2010a and the groove 2010b on the upper surface of the shelf 2010, respectively. However, the disclosed technique is not limited thereto. The gap 40 may be formed between the clamp ring 30 and the shelf 2010 by other methods. For example, as another aspect, a convex portion or a groove may be formed on the lower surface of the clamp ring 30 that is brought into contact with the upper surface of the shelf 2010. Alternatively, a convex portion or a groove may be formed on both the lower surface of the clamp ring 30 and the upper surface of the shelf 2010. Alternatively, one or both of the lower surface of the clamp ring 30 and the upper surface of the shelf 2010 may be subjected to a roughening process.

Further, in the above-described embodiments, by using isocyanate as the first monomer and amine as the second monomer, a polymer film having a urea bond (—NH—CO—NH—) is formed on the surface of the substrate W. However, the disclosed technique is not limited thereto. For example, by using epoxide as the first monomer and amine as the second monomer, a polymer film having a 2-amino-ethanol bond (—NH—CH2-CH(OH)—) may be formed on the surface of the substrate W. Alternatively, by using isocyanate as the first monomer and alcohol as the second monomer, a polymer film having a urethane bond (—NH—CO—O—) may be formed on the surface of the substrate W. Alternatively, by using acyl halide as the first monomer and amine as the second monomer, a polymer film having an amide bond (—NH—CO—) may be formed on the surface of the substrate W. Alternatively, by using carboxylic acid anhydride as the first monomer and amine as the second monomer, a polymer film having an imide bond (—CO—N(—)—CO—) may be formed on the surface of the substrate W.

When the polymer film having the imide bond is formed on the surface of the substrate W, for example, pyromellitic dianhydride (PMDA) or the like may be used as the first monomer. Further, when the polymer film having the imide bond is formed on the surface of the substrate W, for example, 4,4'-oxydianiline (44ODA), hexamethylenediamine (HMDA), or the like may be used as the second monomer.

Further, in the above-described embodiments, an apparatus for forming a film has been described as an example of the substrate processing apparatus 10, but the disclosed technique is not limited thereto. As long as the substrate processing apparatus is provided with the clamp ring 30, the disclosed technique may be applied to an apparatus for performing etching, an apparatus for modifying the substrate W, and the like, in addition to the apparatus for forming a film.

It should be noted that the embodiments disclosed herein should be considered as illustrative in all respects and not restrictive. Indeed, the above-described embodiments may be embodied in many different forms. Further, the above-described embodiments may be omitted, substituted, or changed in various ways without departing from the scope and spirit of the appended claims. Moreover, the above-described embodiments may be appropriately combined to the extent that they are not structurally contradictory.

Hereinafter, the above-described embodiments will be additionally described as supplementary notes.

(Supplementary Note 1)

A substrate processing apparatus including:

a processing container;

a stage provided inside the processing container to place a substrate on the stage;

an exhaust port arranged around the stage along an inner wall of the processing container;

a driver configured to move the stage up and down between a processing position where the substrate placed on the stage is processed, and a transfer position which is lower than the processing position and is a position when the substrate is loaded onto the stage and when the substrate is unloaded from the stage;

a clamp ring that is arranged on a peripheral edge of the substrate on the stage to cover the peripheral edge of the substrate when the stage is at the processing position, and is supported by a shelf provided on a sidewall of the processing container when the stage is at the transfer position; and a pressure regulating mechanism configured to suppress a pressure difference between a space above the substrate on the stage and a space below the stage.

(Supplementary Note 2)

The substrate processing apparatus of Supplementary Note 1, wherein the pressure regulating mechanism is a through-hole formed along a thickness direction of the clamp ring.

(Supplementary Note 3)

The substrate processing apparatus of Supplementary Note 2, further including: a showerhead provided in an upper portion of the processing container and configured to supply a processing gas for processing the substrate on the stage into the processing container from a discharge port provided in a lower surface of the showerhead, wherein the through-hole is formed in a region outside a region where the discharge port is provided in a plan view.

(Supplementary Note 4)

The substrate processing apparatus of Supplementary Note 2 or 3, wherein a convex portion that protrudes downward from the upper portion of the processing container is provided in the upper portion of the processing container, and wherein the convex portion blocks an opening of the through-hole by being inserted into the through-hole of the clamp ring when the stage is at the processing position, and opens the opening of the through-hole by being separated from the through-hole of the clamp ring when the stage moves from the processing position to the transfer position.

(Supplementary Note 5)

The substrate processing apparatus of Supplementary Note 1, wherein the pressure regulating mechanism is a gap formed between the clamp ring and the shelf (Supplementary Note 6)

The substrate processing apparatus of Supplementary Note 5, wherein a convex portion is provided on the upper surface of the shelf, and wherein a gap is formed between the lower surface of the clamp ring and the upper surface of the shelf as the clamp ring is supported by the convex portion when the stage moves from the processing position to the transfer position.

(Supplementary Note 7)

The substrate processing apparatus of Supplementary Note 5, wherein a groove extending to the outside of a region of the clamp ring in a plan view is formed on the upper surface of the shelf, and a gap is formed between the lower surface of the clamp ring and the groove of the shelf when the stage moves from the processing position to the transfer position.

(Supplementary Note 8)

The substrate processing apparatus of Supplementary Note 1, wherein the pressure regulating mechanism is a pipe that connects the space above the substrate on the stage and the space below the stage.

(Supplementary Note 9)

The substrate processing apparatus of Supplementary Note 8, wherein the pipe is provided with a valve that is closed when the stage is at the processing position and is opened when the stage moves from the processing position to the transfer position.

(Supplementary Note 10)

The substrate processing apparatus of any one of Supplementary Notes 1 to 8, wherein a purge gas is supplied to the space below the stage.

According to various aspects and embodiments of the present disclosure, it is possible to rapidly unload a substrate after processing.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a processing container;
a stage provided inside the processing container to place a substrate on the stage;
an exhaust port arranged around the stage along an inner wall of the processing container;
a driver configured to move the stage up and down between a processing position where the substrate placed on the stage is processed, and a transfer position which is lower than the processing position and is a position when the substrate is loaded onto the stage and when the substrate is unloaded from the stage;
a clamp ring that is arranged on a peripheral edge of the substrate on the stage to cover the peripheral edge of the substrate when the stage is at the processing position, and is supported by a shelf provided on a sidewall of the processing container when the stage is at the transfer position; and
a pressure regulating mechanism configured to suppress a pressure difference between a space above the substrate on the stage and a space below the stage,
wherein the pressure regulating mechanism is a through-hole formed along a thickness direction of the clamp ring,
wherein a convex portion that protrudes downward from an upper portion of the processing container is provided in the upper portion of the processing container, and
wherein the convex portion blocks an opening of the through-hole by being inserted into the through-hole of the clamp ring when the stage is at the processing position, and opens the opening of the through-hole by being separated from the through-hole of the clamp ring when the stage moves from the processing position to the transfer position.

2. The substrate processing apparatus of claim 1, further comprising: a showerhead provided in an upper portion of the processing container and configured to supply a processing gas for processing the substrate on the stage into the processing container from a discharge port provided in a lower surface of the showerhead,
wherein the through-hole is formed in a region outside a region where the discharge port is provided in a plan view.

3. A substrate processing apparatus comprising:
a processing container;
a stage provided inside the processing container to place a substrate on the stage;
an exhaust port arranged around the stage along an inner wall of the processing container:
a driver configured to move the stage up and down between a processing position where the substrate placed on the stage is processed, and a transfer position which is lower than the processing position and is a position when the substrate is loaded onto the stage and when the substrate is unloaded from the stage;
a clamp ring that is arranged on a peripheral edge of the substrate on the stage to cover the peripheral edge of the substrate when the stage is at the processing position, and is supported by a shelf provided on a sidewall of the processing container when the stage is at the transfer position; and
a pressure regulating mechanism configured to suppress a pressure difference between a space above the substrate on the stage and a space below the stage,
wherein the pressure regulating mechanism is a gap formed between the clamp ring and the shelf,
wherein a convex portion is provided on an upper surface of the shelf, and
wherein the gap is formed between a lower surface of the clamp ring and the upper surface of the shelf as the clamp ring is supported by the convex portion when the stage moves from the processing position to the transfer position.

4. A substrate processing apparatus comprising:
a processing container;

a stage provided inside the processing container to place a substrate on the stage;

an exhaust port arranged around the stage along an inner wall of the processing container:

a driver configured to move the stage up and down between a processing position where the substrate placed on the stage is processed, and a transfer position which is lower than the processing position and is a position when the substrate is loaded onto the stage and when the substrate is unloaded from the stage;

a clamp ring that is arranged on a peripheral edge of the substrate on the stage to cover the peripheral edge of the substrate when the stage is at the processing position, and is supported by a shelf provided on a sidewall of the processing container when the stage is at the transfer position; and a pressure regulating mechanism configured to suppress a pressure difference between a space above the substrate on the stage and a space below the stage, wherein the pressure regulating mechanism is a gap formed between the clamp ring and the shelf, and wherein a groove that extends beyond a region of the clamp ring in a plan view is formed in an upper surface of the shelf, and the gap is formed between a lower surface of the clamp ring and the groove of the shelf when the stage moves from the processing position to the transfer position.

5. A substrate processing apparatus comprising:

a processing container:

a stage provided inside the processing container to place a substrate on the stage;

an exhaust port arranged around the stage along an inner wall of the processing container;

a driver configured to move the stage up and down between a processing position where the substrate placed on the stage is processed, and a transfer position which is lower than the processing position and is a position when the substrate is loaded onto the stage and when the substrate is unloaded from the stage;

a clamp ring that is arranged on a peripheral edge of the substrate on the stage to cover the peripheral edge of the substrate when the stage is at the processing position, and is supported by a shelf provided on a sidewall of the processing container when the stage is at the transfer position; and a pressure regulating mechanism configured to suppress a pressure difference between a space above the substrate on the stage and a space below the stage, wherein the pressure regulating mechanism is a pipe that connects the space above the substrate on the stage and the space below the stage, and wherein the pipe is provided with a valve configured to be closed when the stage is at the processing position and be opened when the stage moves from the processing position to the transfer position.

6. The substrate processing apparatus of claim 1, wherein a purge gas is supplied to the space below the stage.

* * * * *